United States Patent
Fertig et al.

(10) Patent No.: US 12,199,624 B2
(45) Date of Patent: Jan. 14, 2025

(54) CONTINUOUS CALIBRATION OF AN ATOMIC CLOCK TO AN EXTERNAL REFERENCE

(71) Applicant: Honeywell International Inc., Charlotte, NC (US)

(72) Inventors: Chad Fertig, Roseville, MN (US); Karl D. Nelson, Plymouth, MN (US)

(73) Assignee: Honeywell International Inc., Charlotte, NC (US)

(*) Notice: Subject to any disclaimer, the term of this patent is extended or adjusted under 35 U.S.C. 154(b) by 70 days.

(21) Appl. No.: 18/311,073

(22) Filed: May 2, 2023

(65) Prior Publication Data

US 2024/0372556 A1 Nov. 7, 2024

(51) Int. Cl.
- *H03L 7/06* (2006.01)
- *H03L 7/089* (2006.01)
- *H03L 7/099* (2006.01)

(52) U.S. Cl.
CPC .......... *H03L 7/0991* (2013.01); *H03L 7/0891* (2013.01)

(58) Field of Classification Search
None
See application file for complete search history.

(56) References Cited

U.S. PATENT DOCUMENTS

| | | | |
|---|---|---|---|
| 7,030,704 B2 * | 4/2006 | White | H03D 5/00 331/3 |
| 7,501,906 B2 | 3/2009 | Dimarcq et al. | |
| 9,077,354 B2 | 7/2015 | Strabley et al. | |
| 9,360,844 B2 | 6/2016 | Gan | |
| 2022/0221589 A1 | 7/2022 | Elgersma et al. | |

FOREIGN PATENT DOCUMENTS

| | | |
|---|---|---|
| CN | 103138755 A | 6/2013 |
| CN | 115037298 A | 9/2022 |
| EP | 4130929 A1 | 2/2023 |
| JP | 2005109619 A | 4/2005 |

OTHER PUBLICATIONS

European Patent Office, "Extended European Search Report", dated Jul. 19, 2024 from EP Application No. 24156674.4, from Foreign Counterpart to U.S. Appl. No. 18/311,073, pp. 1 through 5, Published: EP.

* cited by examiner

*Primary Examiner* — Jeffrey S Zweizig
(74) *Attorney, Agent, or Firm* — Fogg & Powers LLC (57) ABSTRACT

An atomic clock is provided. An output of a tunable LO is coupled to a user output of the atomic clock. A charge pump adjusts the tunable LO with a LO tuning voltage. A follower circuit sets an output frequency of the atomic clock to a frequency of an external reference signal coupled to an external reference input. An atom referenced circuit sets the output frequency of the atomic clock to a frequency based on stored operating settings. A controller stores then current operating settings generated based on a then current external reference signal coupled to the external reference input. The controller is further configured to apply the stored then current operating settings to the atom referenced circuit when the then current external reference signal is removed from the external reference input to maintain the output frequency of the atomic clock at the output frequency set by the follower circuit.

20 Claims, 3 Drawing Sheets

CONTINUOUS CALIBRATION OF AN ATOMIC CLOCK TO AN EXTERNAL REFERENCE

STATEMENT REGARDING FEDERALLY SPONSORED RESEARCH OR DEVELOPMENT

This invention was made with Government support under W911NF-21-2-0229 awarded by Army Research Laboratory. The Government has certain rights in the invention.

BACKGROUND

Atomic clocks, including miniature atomic clocks, may be used to provide a timing reference in a device or system. A timing output of an atomic clock has an intrinsic stability that is derived from an internal component such as a cell that contains atomic vapor. Energy levels of the atoms in the atomic vapor are used as a master absolute frequency reference. A common example of atomic vapor that may be used is Rubidium atomic vapor. In this example, the system uses Rubidium energy levels as a reference.

Examples of systems that implement atomic clocks include a global positioning system (GPS) and networks that need to synchronize communications between components. A GPS disciplined oscillator (GPSDO) is a combination with a GPS receiver and an internal atomic clock whose output is controlled to agree with signals broadcast by GPS satellites or other global network satellites system (GNSS) satellites.

In a timing distribution system, an atomic clock may be utilized to provide holdover timing or maintaining the output of accurate timing signal through a disruptive event such as the loss of a primary timing reference such as GPS. To deliver holdover timing, the atomic clock output should maintain the phase and frequency of the primary timing reference across the disruptive event such that downstream systems reliant on the phase and frequency of the timing signals are minimally impacted by the disruption event. Currently known techniques of providing holdover timing by locking the output frequency of an atomic clock to a primary timing reference have the drawback that the output of the atomic clock may, in the event of a disruption of the timing reference, revert to free running frequency and phase that is substantially different from the timing reference.

For the reasons stated above and for other reasons stated below which will become apparent to those skilled in the art upon reading and understanding the present specification, there is a need in the art for an atomic clock system that delivers a timing signal output which maintains phase and frequency continuity with a primary reference, across a disruption in the availability of a primary reference.

SUMMARY

The following summary is made by way of example and not by way of limitation. It is merely provided to aid the reader in understanding some of the aspects of the subject matter described. Embodiments provide an atomic clock that generates an output signal of a select frequency at a user output that is determined by selectively applying one of an atom referenced circuit that is configured to set the output frequency at the user output based on stored operating settings or a follower circuit that is configured to set the output frequency at the user output based on a reference signal supplied by a user.

In one embodiment, an atomic clock is provided. The atomic clock includes a tunable LO, a charge pump, a follower circuit, an atom referenced circuit, a switch, a controller, and a memory. An output of the tunable LO is coupled to a user output of the atomic clock. The charge pump is configured to adjust the tunable LO with a LO tuning voltage. The follower circuit is configured to set an output frequency of the atomic clock to a frequency of an external reference signal coupled to an external reference input. The atom referenced circuit is configured to set the output frequency of the atomic clock to a frequency based on stored operating settings. The switch is configured to selectively couple one of the follower circuit and the atom referenced circuit to the charge pump. The controller is configured to control the switch based on a detected external reference signal coupled to the external reference input. The memory is configured to store at least the operating settings and operating instructions implemented by the controller. The controller is configured to store then current operating settings generated based on a then current external reference signal coupled to the external reference input. The controller is further configured to apply the stored then current operating settings to the atom referenced circuit when the then current external reference signal is removed from the external reference input to maintain the output frequency of the atomic clock at the output frequency set by the follower circuit when the external reference signal was coupled to the external reference input.

In another embodiment, another atomic clock is provided. The atomic clock includes an ensemble of atoms, a tunable LO, a synthesizer circuit, an atomic spectroscopy circuit, spectroscopy detection circuit, a memory, a controller, a charge pump, an external reference input, a signal level sensor, a phase-frequency detector circuit (PFDC), and a switch. The tunable local oscillator (LO) has a frequency that is tuned by a LO tuning voltage. The tunable LO is in communication with a user output of the atomic clock. The synthesizer circuit creates a synthesized signal that has a frequency that is a rational number multiple of the frequency of the tunable LO based on a synthesizer tuning word in a received synthesizer tuning word signal. The ensemble of atoms has a spectroscopic response at an atomic resonance frequency. The atomic spectroscopy circuit is configured to excite the ensemble of atoms with the synthesized signal. The atomic spectroscopy circuit is further configured to change the atomic resonant frequency of the ensemble of atoms with an application of an electromagnetic field having a strength based on an atom tuning word in a received atom tuning word signal. The spectroscopy detection circuit is configured to output a difference signal indicating a difference in frequency between the frequency of the synthesized signal and the atomic resonance frequency of the ensemble of atoms. The memory is configured to store operating settings and operating instructions. The operating settings include the synthesizer tuning word and the atom tuning word. The controller is in communication with the memory. The controller is configured to at least implement the operating instructions and store the operating settings. The controller is configured to determine the operating settings based at least in part on the output of the spectroscopy detection circuit. The controller is further configured to generate controller digital pumping signals based at least in part on the output of the spectroscopy detection circuit. The controller is also configured to store then current operating settings generated based on a then current external reference signal coupled to an external reference input. The controller is further configured to apply a synthesizer tuning word associated with the stored then current operating settings to the synthesizer circuit and an atomic tuning word associated with the then current operating setting to the atomic spectroscopy circuit when the then current external reference signal is removed from the external reference input to maintain the output frequency of the atomic clock at the output frequency set by the removed then current external reference signal. The charge pump is in communication with the tunable LO to generate the LO tuning voltage used by the tunable LO. The charge pump includes an input. The signal level sensor is configured to detect an external reference signal at the external reference input. The signal level sensor is in communication with the controller. The phase-frequency detector circuit (PFDC) is configured to selectively compare the frequency of the tunable LO to a frequency of the external reference signal at the external reference input and generate PFDC digital pumping signals in response to the comparison when a signal is detected by the signal level sensor. The switch is configured to selectively couple one of the controller digital pumping signals from the controller and PFDC digital pumping signals from the PFDC to the input of the charge pump to generate the LO tuning voltage that tunes the tunable LO. The controller is configured to control a position of the switch based on an output of the signal level sensor.

In yet another embodiment a method of operating an atomic clock is provided. The method includes generating a synthesized signal having a frequency that is a rational number multiple of a frequency of a tunable local oscillator (LO) signal from a tunable LO that is communication with a user output of the atomic clock with a synthesizer circuit; comparing a difference in frequency between the frequency of the synthesized signal output from the synthesizer circuit and a resonance frequency of an ensemble of atoms in an atomic spectroscopy circuit; generating operating settings used by the synthesizer circuit and the atomic spectroscopy circuit based on the comparison of the difference in frequency between the frequency of the synthesized signal output from the synthesizer circuit and the resonance frequency of the ensemble of atoms in the atomic spectroscopy circuit with a spectroscopy detection circuit; storing the operating settings in a memory; controlling the frequency of the synthesized signal generated by the synthesizer circuit and the resonance frequency of the ensemble of atoms in the atomic spectroscopy circuit with the operating settings; coupling digital pumping signals to a charge pump to generate a tuning voltage to tune the tunable LO; selectively applying the digital pumping signals from a phase-frequency detector circuit (PFDC) when an external reference signal is detected at an external reference input; and selectively applying the digital pumping signals based on an output of the spectroscopy detection circuit when an external reference signal is not detected at the external reference input using then current operating settings stored in the memory to maintain an output frequency of the atomic clock at an output frequency set by a last detected external reference signal.

BRIEF DESCRIPTION OF THE DRAWINGS

The present invention can be more easily understood and further advantages and uses thereof will be more readily apparent, when considered in view of the detailed description and the following figures in which.

In accordance with common practice, the various described features are not drawn to scale but are drawn to emphasize specific features relevant to the present invention. Reference characters denote like elements throughout Figures and text.

DETAILED DESCRIPTION

In the following detailed description, reference is made to the accompanying drawings, which form a part hereof, and in which is shown by way of illustration specific embodiments in which the inventions may be practiced. These embodiments are described in sufficient detail to enable those skilled in the art to practice the invention, and it is to be understood that other embodiments may be utilized and that changes may be made without departing from the spirit and scope of the present invention. The following detailed description is, therefore, not to be taken in a limiting sense, and the scope of the present invention is defined only by the claims and equivalents thereof.

Embodiments of the present invention provide an atomic clock that includes an atom referenced mode and a follower mode. In an embodiment, the follower mode is used during manufacture to set an initial factory calibration of the atomic clock. The follower mode may also be used with a user supplied reference signal to reset the calibration of the atomic clock at any time in an example. Embodiments use a follower circuit that is configured to set an output of the atomic clock to a frequency of a reference signal supplied by a user at an external reference input. Examples of user supplied reference signals include external reference signals used to synchronize the atomic clock with satellite signals in a global positioning system and computer network time server reference signals used to synchronize communications between network components.

In the atom referenced mode, in one example, the atomic clock retains the frequency it was last supplied thru the external reference input with the use of stored operating settings. Other stored operating settings may also be selected to be used instead of the most resent as discussed below in some embodiments. Embodiments use an atom referenced circuit that is configured to set the user output frequency of the atomic clock based at least in part on the stored operating settings. Further, in examples, a switch is controlled based on the detection of an external reference signal to select between the follower circuit and the atom referenced circuit to provide select digital pumping signals used by a charge pump to tune a tunable local oscillator that provides the output of the atomic clock.

Figure 1:
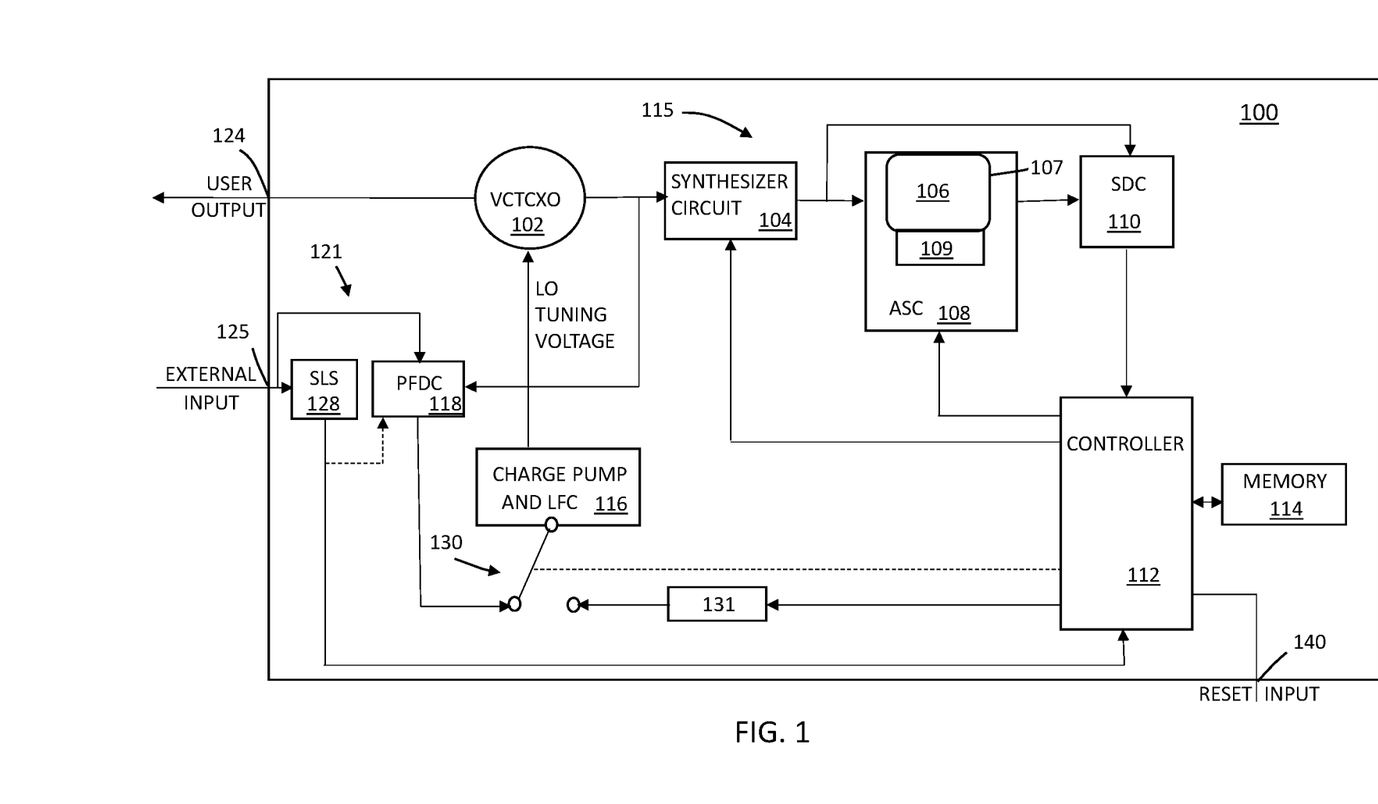
FIG. 1 is a block diagram of an atomic clock in a follower mode according to an example aspect of the preset invention.

Referring to FIG. 1, an example block diagram of an atomic clock 100 with continuous recalibration to a user provided external reference signal is illustrated. The atomic clock 100 includes tunable local oscillator (LO) 102. The tunable LO 102 in this example is a voltage-controlled temperature compensated crystal oscillator (VCTCXO) that is able to change frequency. The frequency of the tunable LO 102 is tuned with the use of a LO tuning voltage, in this example, that is supplied by a charge pump 116 that may include a loop filter circuit (LFC). The tunable LO 102 is in communication with a user output 124 of the atomic clock 100 to output signals at a select frequency.

The atomic clock 100 in examples, includes a follower circuit 121 and an atom referenced circuit 115. A switch 130 is selectively positioned, as discussed below, to allow either the follower circuit 121 or the atom referenced circuit 115 to provide the digital pumping samples to an input of the charge pump 116 which generates the LO tuning voltage to tune the tunable LO 102.

The atom referenced circuit 115 includes a synthesizer circuit 104, that is in communication with an output of the tunable LO 102. The synthesizer circuit 104 creates a synthesized signal having a frequency that is a rational number multiple of the frequency of the tunable LO 102. The synthesizer circuit 104 includes an oscillator operating at select frequency set by a synthesizer tuning word provided by a controller 112. The frequency of the oscillator of synthesizer circuit 104 is a rational number multiple of the output of the tunable LO 102. For example, if the frequency of the oscillator in synthesizer circuit 104 is operating at a microwave frequency of 3.40 GHz and if an output signal of the tunable LO 102 is at a frequency of 10 MHZ, the rational number multiplier is 340. The synthesizer circuit 104 creates a signal, that is phase coherent with the tunable LO, at a frequency suitable for exciting a spectroscopic response in the ensemble of atoms 106.

The ensemble of atoms 106, that have a spectroscopic response at an atomic resonance frequency, is in communication with an output synthesized signal generated by the synthesizer circuit 104. In an example, the ensemble of atoms 106 is contained within a vacuum chamber 107 of an atomic spectroscopy cell (ASC) 108. The ASC 108 is designed to excite the ensemble of atoms 106 with the synthesized signal from the synthesizer circuit 104. The ASC 108 is further designed to change the atomic resonant frequency of the ensemble of atoms 106 based on an atomic tuning word in an atomic tuning word signal provided by the controller 112. The atomic tuning word includes information used to tune the resonance frequency of ensemble of atoms 106. Any type of atom tuning system 109 that changes the resonance frequency of the ensemble of atoms 106 may be used by the ASC 108. Examples of such systems include, but are not limited to, systems that generate magnetic fields, electric fields, optical fields, temperature changes, etc. In one example, the atom tuning system 109 includes an electromagnetic coil that is positioned or wrapped around the vacuum chamber 107 that holds the ensemble of atoms 106. The coil generates a magnetic field that changes the resonance frequency of the ensemble of atoms 106 through the quadratic Zeeman (QZ) frequency shift effect. The atomic tuning word in an atomic tuning word signal generated by the controller 112 is used to adjust the electric current flowing through the coil to adjust the magnetic field to adjust the frequency of the atomic resonance, based on an output of a spectroscopy detection circuit (SDC) 110 in this example.

The SDC 110, of the atom referenced circuit 115, is in communication with an output of the ASC 108. The SDC 110 is designed to output a signal proportional to the difference in frequency between the frequency of the synthesized signal from the synthesizer circuit 104 and the resonance frequency of the ensemble of atoms 106. The SDC 110 in an example includes processing electronics that does a conversion of a difference in frequency into an output voltage that is communicated to the controller 112.

The controller 112 is in communication with a memory 114 that includes at least stored operation instructions and operating settings. In general, the controller 112 may include any one or more of a processor, microprocessor, a digital signal processor (DSP), an application specific integrated circuit (ASIC), a field program gate array (FPGA), or equivalent discrete or integrated logic circuitry. In some example embodiments, controller 112 may include multiple components, such as any combination of one or more microprocessors, one or more controllers, one or more DSPs, one or more ASICs, one or more FPGAs, as well as other discrete or integrated logic circuitry. The functions attributed to the controller 112 herein may be embodied as software, firmware, hardware or any combination thereof. The controller 112 may be part of a system controller or a component controller. The memory 114 may include computer-readable operating instructions that, when executed by the controller 112 provides functions of the atomic clock 100. Such functions may include the functions of controlling an output frequency of the atomic clock. The computer readable instructions may be encoded within the memory. Memory 114 is an appropriate non-transitory storage medium or media including any volatile, nonvolatile, magnetic, optical, or electrical media, such as, but not limited to, a random access memory (RAM), read-only memory (ROM), non-volatile RAM (NVRAM), electrically-erasable programmable ROM (EEPROM), flash memory, or any other storage medium.

As discussed above, the memory 114 is configured to store operating settings and operating instructions. The operating settings may include at least a first value of a synthesizer tuning word communicated to the synthesizer circuit 104 in a synthesized tuning word signal. The synthesizer tuning word includes specific frequency information to be used by oscillator of the synthesizer circuit 104. The operating settings further include at least a first value of an atom tuning word communicated to the ASC 108 through an atom tuning word signal. The atom tuning word includes information needed to change the resonance frequency of the ensemble of atoms 106 such as, in an embodiment, a specific electromagnetic filed strength needed, or a current needed to create the specific electromagnetic field strength.

The controller 112 implements the operating instructions in the memory 114 and stores the operating settings in an example. In one example, the operating instructions are determined to achieve a result of zero difference in frequency between the frequency of the synthesized signal from the synthesizer circuit 104 and the resonance frequency of the ensemble of atoms 106 as determined by the SDC 110. In one example, the controller 112 is configured to store a value of the synthesizer tuning word and a value of the atom tuning word in the memory 114 that achieves the zero difference between the frequency of the synthesized signal from the synthesizer circuit 104 and the resonance frequency of the ensemble of atoms 106.

Controller 112 is in communication with synthesizer circuit 104 to provide a synthesizer tuning word signal including a then current synthesizer tuning word from memory. Controller 112 is also in communication with the ASC 108 to provide an atom tuning word signal that includes a then current atom tuning word from memory. The controller 112 is further configured to generate controller digital pumping signals based on the output voltage of the SDC 110. In one example, the controller 112 processes the spectroscopy detector output voltage with servocontrol electronics. For example, the controller 112 may include a proportional-integral differential (PID) controller that determines a control signal The control signal is transmitted to the charge pump controller 131 which may be part of the of the controller, the charge pump 116, or a separate digital circuit, that generates the controller digital pumping signals that include voltage pulses of a suitable amplitude, duration, and repetition rate to stimulate the charge pump 116 to produce the LO tuning voltage to tune the tunable LO 102. In some embodiments, the controller 112, using stored operating settings (i.e., a stored synthesizer tuning word and a stored atom tuning word) and using the output of the SDC110, determines LO steering values that cause the user output 124 of the atomic clock 100 to be substantially identical to that obtained when an external reference signal applied to the external reference input 125 determined the LO steering value prior to a loss of signal at the external reference input 125.

The atomic clock 100 also includes the external reference input 125 into which an external frequency reference may be provided. The follower circuit 121 includes a signal level sensor (SLS) 128 that is configured to detect the presence of an external reference signal at the external reference input 125. The SLS 128 includes an output that is in communication with the controller 112. Based on an output signal of the SLS 128, the controller 112 determines if an external reference signal is being received at the external reference input 125.

The follower circuit 121 further includes a phase-frequency detector circuit (PFDC) 118, that, when a signal is detected by the SLS 128, is configured to selectively compare the frequency of a signal output from the tunable LO 102 to the frequency of an external reference signal and generate PFDC digital pumping signals in response to the comparison.

Figure 2:
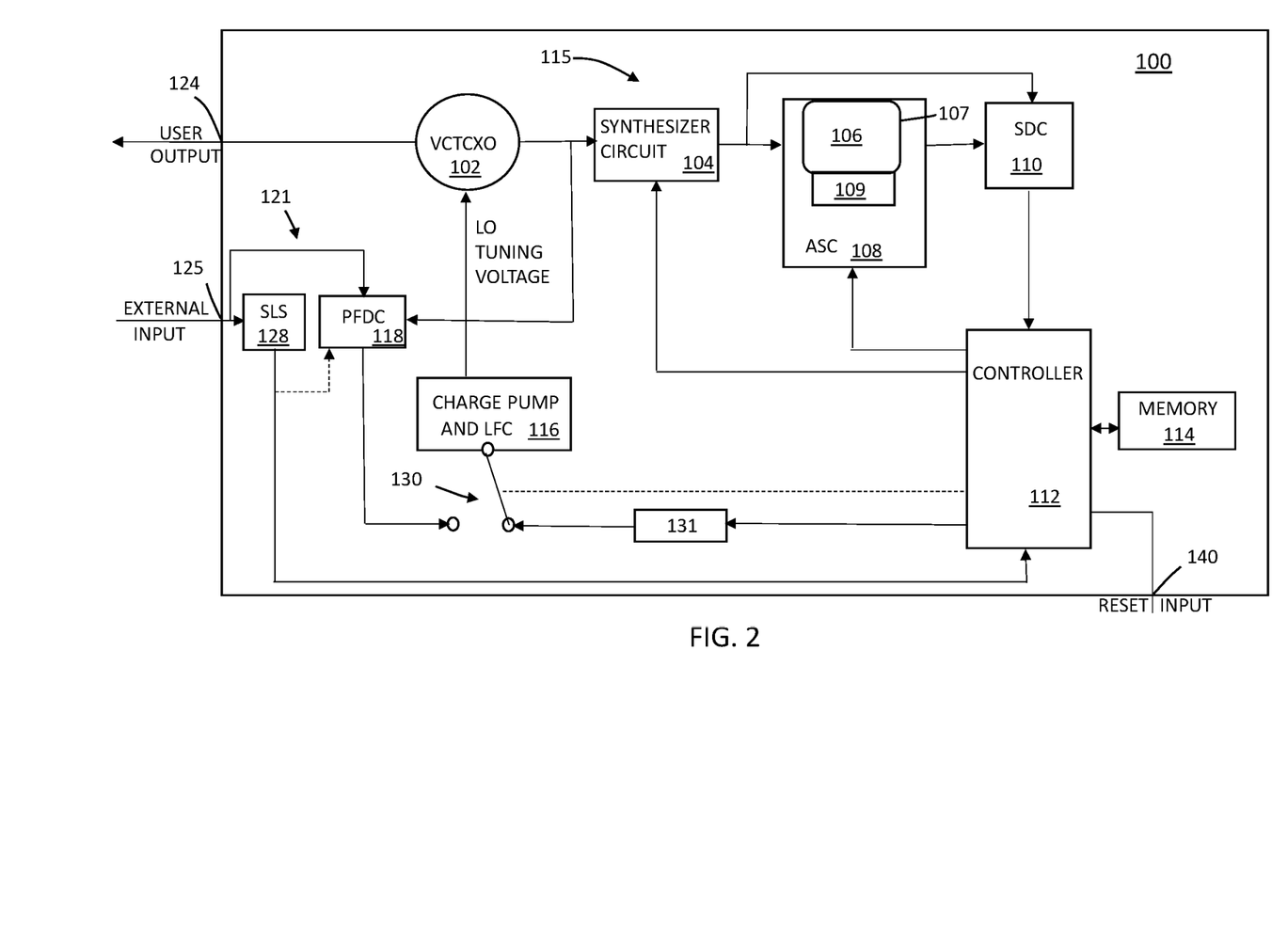
FIG. 2 is a block diagram of an atomic clock in an atom referenced mode according to an example aspect of the preset invention.

The switch 130 is positioned to selectively couple either the controller digital pumping signal or the PFDC digital pumping signal to the input of the charge pump 116 to generate the LO tuning voltage, as discussed above. The controller 112 is configured to control the position of the switch 130 based on the output of the SLS 128. FIG. 1 illustrates the atomic clock in follower mode, and FIG. 2 illustrates the atomic clock in atom referenced mode.

In follower mode, the output of the atomic clock 100, by the action of the follower circuit 121 and its PFDC 118, faithfully reproduces the phase and frequency of the external reference signal provided at input 125.

In atom referenced mode the output of the atomic clock is based on the then current operating settings stored in memory 114. In this configuration the tunable LO 102 is steered to agree with an atomic energy level in the ensemble of atoms 106. In particular, a LO tunning voltage that is derived by processing the frequency difference between the frequency of synthesizer circuit 104 and ensemble of atoms 106, as determined by the SDC 110, is used to change the frequency of the tunable LO 102 so to agree with atomic energy levels in the ensemble of atoms 106.

As discussed above, the atomic clock 100 has the ability to learn what the external reference frequency is and modify its operating state so that it falls in line with the external reference signal. When in the follower mode, although the atom referenced circuit 115 is not actively providing the digital pumping samples to the charge pump 116, the circuit is still operating as described above so the controller 112 is able to store the operating settings in the memory 114. Hence, in the event of a loss of the external reference signal, the atomic clock 100 can switch to an atom referenced mode in which the user output 124 is maintained at the frequency and phase of the external reference signal at the time of the loss of the external reference signal through the use of the stored then current operating settings that include the most current synthesizer tuning word used to generate the synthesizer tuning word signal and the most current atom tuning word used to generate the atom tuning word signal. Some examples allow the atomic clock to be revert back to factory calibration setting by using a synthesizer tuning word and an atom tuning word stored in the memory 114 at the factory during initial calibration. This may be achieved by the controller 112 receiving a reset input signal at a reset input 140.

Figure 3:
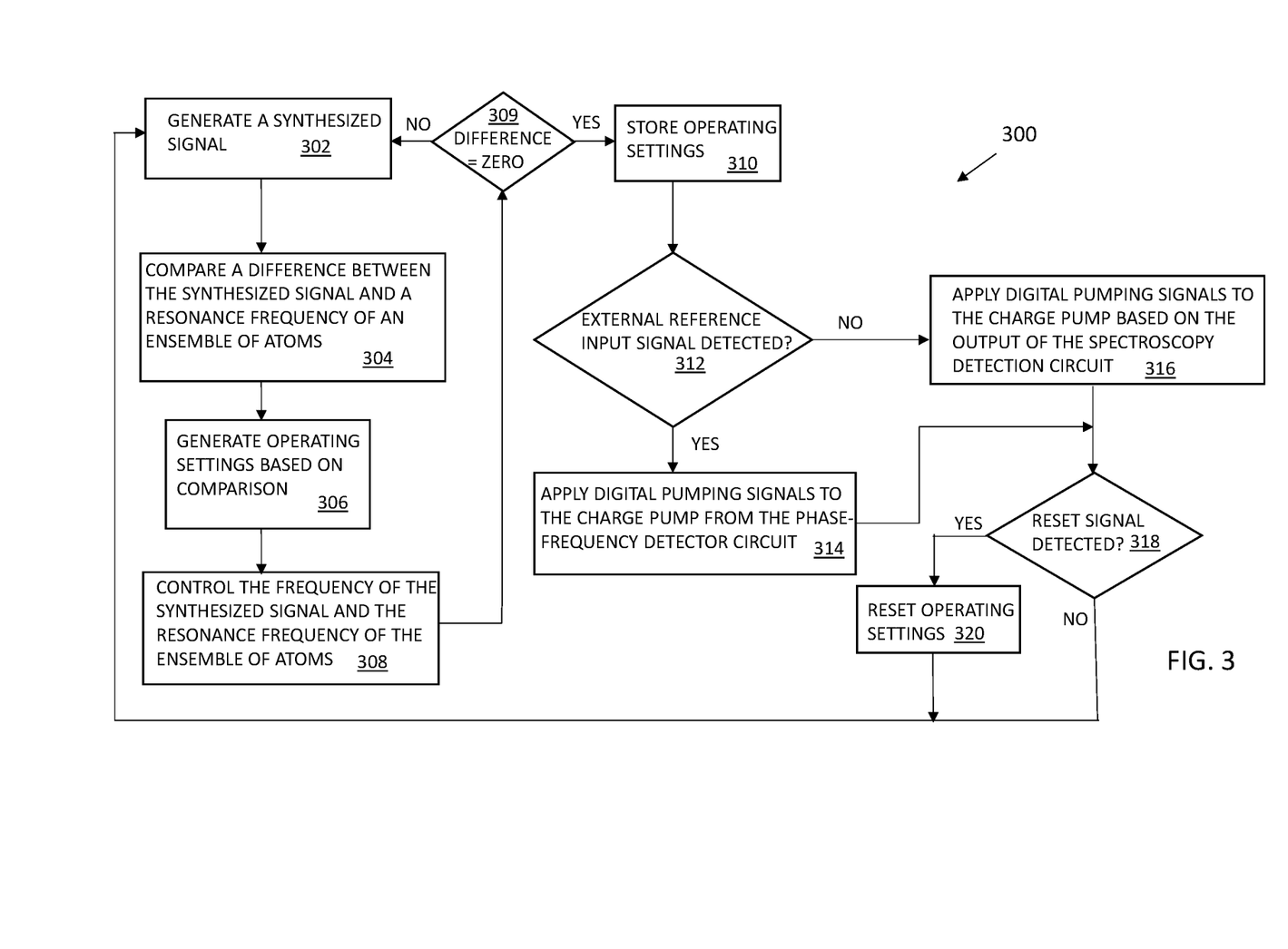
FIG. 3 illustrates an atomic clock operation flow diagram according to an example aspect of the preset invention.

Referring to FIG. 3, an example atomic clock operation flow diagram 300 is illustrated. The atomic clock operation flow diagram 300 is provided as a series of sequential blocks. The sequence of blocks may occur in a different order or in parallel in other embodiments. Hence the invention is not limited to the sequential sequence as set out in FIG. 3.

The atomic clock operation flow diagram 300 in this example starts at block 302 generating a synthesized signal with a synthesizer circuit 104 that has a frequency that is a rational number multiple of the frequency of the tunable local oscillator (LO) signal from the tunable LO 102. At block 304, a difference in frequency between the frequency of the synthesized signal output from the synthesizer circuit 104 is and the resonance frequency of an ensemble of atoms in an atomic spectroscopy circuit is compared. As discussed above, this may be done with the SDC 110 that outputs a voltage that indicates a difference in frequency.

At block 306, operating settings used by the synthesizer circuit 104 and the ASC 108 are generated based on the comparison of the difference in frequency between the frequency of the synthesized signal output from the synthesizer circuit 104 and the resonance frequency of the ensemble of atoms 106, as measured in the ASC 108. At block 308, the frequency of the synthesized signals of the synthesizer circuit 104 is controlled by the synthesizer tuning word of operating instructions, and the resonance frequency of the ensemble of atoms is controlled by the atom tuning word of the operating instructions.

At block 309, it is determined if the difference in frequency between the frequency of the synthesized signal output from the synthesizer circuit 104 and the resonance frequency of the ensemble of atoms 106 in the ASC 108 is different from zero. This is done in an example with the controller 112 monitoring the output voltage of the SDC 110. If it is determined at block 309 the difference is not zero, the process continues at block 302 with the synthesizer circuit 104 outputting a synthesized signal. The output of the synthesizer circuit 104 is based on a then current output of the tunable LO 102 and a then current synthesizer tuning word. If it is determined at block 309, the difference is zero, the operating settings are stored in the memory 114 at block 310. Hence, embodiments may dynamically update the operating settings as the external reference input signal changes frequency.

In some embodiments, the past operating settings are stored in memory so the atomic clock 100 can be re-set to past operating settings, including those settings established during factory calibration, if desired. Further, storing the current settings is a dynamic operation so that any changes in operating settings initiated by the clock in response to changes in the external reference signals applied the at the external reference input are captured in the memory 114.

At block 312 it is determined if an external reference signal is present at the external signal input 125. In one example this is done with a SLS 128. An output of the SLS 128 is communicated to the controller 112 in an example where the controller 112 controls the switch 130 to selectively direct digital pumping signals to the charge pump 116.

If it is determined at block 312 that an external reference signal is detected, digital pumping signals from the PFDC 118 are applied to charge pump 116 at block 314 thereby causing the tunable LO 102 to follow the external reference signal in phase and frequency. If is determined that an external reference signal is not detected at block 312, digital pumping signals from controller 112 that are based on the output of the SDC 110 are applied to the charge pump 116 at block 316. The digital pumping signals from controller 112, through the use of the most current (or then current) stored operating settings, will thus cause the tunable LO 102 to output a signal with a frequency that matches the last external reference signal applied to the external reference input 125.

In an example that includes a command to perform a factory reset, the process continues at block 318 determining if a factory reset commend has been received by the controller 112. If a reset signal has not been received at block 318, the process continues at block 302. If a factory reset has been received at block 318, factory operating settings stored in the memory 114 are communicated to the synthesizer circuit 104 and the ASC 108 to change the output frequency of the atomic clock 100 at block 320. In an embodiment, the controller 112 will move the switch to couple the digital pumping signals from the controller 112 to the charge pump 116 when a reset signal is detected. After the factory reset in this example, the process continues at block 302.

Example Embodiments

Example 1 includes an atomic clock. The atomic clock includes a tunable LO, a charge pump, a follower circuit, an atom referenced circuit, a switch, a controller, and a memory. An output of the tunable LO is coupled to a user output of the atomic clock. The charge pump is configured to adjust the tunable LO with a LO tuning voltage. The follower circuit is configured to set an output frequency of the atomic clock to a frequency of an external reference signal coupled to an external reference input. The atom referenced circuit is configured to set the output frequency of the atomic clock to a frequency based on stored operating settings. The switch is configured to selectively couple one of the follower circuit and the atom referenced circuit to the charge pump. The controller is configured to control the switch based on a detected external reference signal coupled to the external reference input. The memory is configured to store at least the operating settings and operating instructions implemented by the controller. The controller is configured to store then current operating settings generated based on a then current external reference signal coupled to the external reference input. The controller is further configured to apply the stored then current operating settings to the atom referenced circuit when the then current external reference signal is removed from the external reference input to maintain the output frequency of the atomic clock at the output frequency set by the follower circuit when the external reference signal was coupled to the external reference input.

Example 2 includes the atomic clock of Example 1, further including a signal level sensor in communication with the external reference input, the signal level sensor configured to communicate an external reference detected signal to the controller when the external reference signal is coupled to the external reference input.

Example 3 includes the atomic clock of Example 2, wherein a phase-frequency detector circuit (PFDC) configured to selectively compare a frequency of a signal output from the tunable LO to the frequency of the external reference signal at the external reference input and generate PFDC digital pumping signals in response to the comparison when a signal is detected by the signal level sensor, the PFDC digital pumping signals being in communication with the switch.

Example 4 includes the atomic clock of any of the Examples 1-3, wherein the atom referenced circuit further includes a synthesizer circuit, an atomic spectroscopy circuit and a spectroscopy detection circuit. The synthesizer circuit is configured to create a synthesized signal having a frequency that is a rational number multiple of the frequency of the tunable LO based on a synthesizer tuning word from the operator settings communicated to the synthesizer circuit in a synthesizer tuning word signal provided by the controller. The atomic spectroscopy circuit is configured to excite an ensemble of atoms with the synthesized signal. The atomic spectroscopy circuit is further configured to change an atomic resonant frequency of the ensemble of atoms with an application of an electromagnetic field that has a strength that is based on an atom tuning word from the operator settings communicated to the atomic spectroscopy circuit in an atom tuning word signal provided by the controller. The spectroscopy detection circuit is configured to output a difference signal indicating a difference in frequency between the frequency of the synthesized signal and the resonance frequency of the ensemble of atoms. The controller is configured to generate the synthesizer tuning word and the atom tuning word based on the output of the spectroscopy detection circuit. The controller is further configured to store a current synthesizer tuning word and a current atom tuning word in a memory when the difference signal output of the spectroscopy detection circuit is zero.

Example 5 includes the atomic clock of Example 4, further including a charge pump controller that is configured to generate controller digital pump signals that are selectively communicated to the charge pump based on a steering voltage generated by the controller, wherein the steering voltage is based on an output of the spectroscopy detection circuit.

Example 6 includes the atomic clock of any of the Examples 4-5, wherein the atomic spectroscopy circuit further includes a vacuum chamber to contain the ensemble of atoms and an atom manipulation system that is configured to manipulate a resonance frequency of the ensemble of atoms.

Example 7 includes the atomic clock of Example 6, wherein the atom manipulation system includes a coil wrapped around the chamber. The coil is configured to generate a magnetic field to manipulate the resonance frequency of the ensemble of atoms.

Example 8 includes the atomic clock of any of the Examples 1-7, further including a reset input configured to receive a result input. The controller configured to reset the output of the atomic clock based on factory operating settings stored in a memory.

Example 9 includes the atomic clock of any of the Examples 1-8 wherein the charge pump includes a loop filter circuit.

Example 10 includes an atomic clock that includes an ensemble of atoms, a tunable LO, a synthesizer circuit, an atomic spectroscopy circuit, spectroscopy detection circuit, a memory, a controller, a charge pump, an external reference input, a signal level sensor, a phase-frequency detector circuit (PFDC), and a switch. The tunable local oscillator (LO) has a frequency that is tuned by a LO tuning voltage. The tunable LO is in communication with a user output of the atomic clock. The synthesizer circuit creates a synthesized signal that has a frequency that is a rational number multiple of the frequency of the tunable LO based on a synthesizer tuning word in a received synthesizer tuning word signal. The ensemble of atoms has a spectroscopic response at an atomic resonance frequency. The atomic spectroscopy circuit is configured to excite the ensemble of atoms with the synthesized signal. The atomic spectroscopy circuit is further configured to change the atomic resonant frequency of the ensemble of atoms with an application of an electromagnetic field having a strength based on an atom tuning word in a received atom tuning word signal. The spectroscopy detection circuit is configured to output a difference signal indicating a difference in frequency between the frequency of the synthesized signal and the atomic resonance frequency of the ensemble of atoms. The memory is configured to store operating settings and operating instructions. The operating settings include the synthesizer tuning word and the atom tuning word. The controller is in communication with the memory. The controller is configured to at least implement the operating instructions and store the operating settings. The controller is configured to determine the operating settings based at least in part on the output of the spectroscopy detection circuit. The controller is further configured to generate controller digital pumping signals based at least in part on the output of the spectroscopy detection circuit. The controller is also configured to store then current operating settings generated based on a then current external reference signal coupled to an external reference input. The controller is further configured to apply a synthesizer tuning word associated with the stored then current operating settings to the synthesizer circuit and an atomic tuning word associated with the then current operating setting to the atomic spectroscopy circuit when the then current external reference signal is removed from the external reference input to maintain the output frequency of the atomic clock at the output frequency set by the removed then current external reference signal. The charge pump is in communication with the tunable LO to generate the LO tuning voltage used by the tunable LO. The charge pump includes an input. The signal level sensor is configured to detect an external reference signal at the external reference input. The signal level sensor is in communication with the controller. The phase-frequency detector circuit (PFDC) is configured to selectively compare the frequency of the tunable LO to a frequency of the external reference signal at the external reference input and generate PFDC digital pumping signals in response to the comparison when a signal is detected by the signal level sensor. The switch is configured to selectively couple one of the controller digital pumping signals from the controller and PFDC digital pumping signals from the PFDC to the input of the charge pump to generate the LO tuning voltage that tunes the tunable LO. The controller is configured to control a position of the switch based on an output of the signal level sensor.

Example 11 includes the atomic clock of Example 10, wherein the controller is further configured to store a factory determined synthesizer tuning word and a factory determined atom tuning word that is used when a reset signal is received by the controller.

Example 12 includes the atomic clock of any of Examples 10-11, further including a reset input in communication with the controller to communicate the reset signal to the controller.

Example 13 includes the atomic clock of any of the Examples 10-12, wherein the controller dynamically updates a stored synthesizer tuning word and a factory determined atom tuning word based at least in part on a then current output of the spectroscopy detection circuit.

Example 14 includes the atomic clock of any of the Examples 10-13, wherein the charge pump includes a loop filter circuit.

Example 15 includes a method of operating an atomic clock, the method including generating a synthesized signal with a synthesizer circuit that has a frequency that is a rational number multiple of a frequency of a tunable local oscillator (LO) signal from a tunable LO that is communication with a user output of the atomic clock; comparing a difference in frequency between the frequency of the synthesized signal output from the synthesizer circuit and a resonance frequency of an ensemble of atoms in an atomic spectroscopy circuit; generating operating settings used by the synthesizer circuit and the atomic spectroscopy circuit based on the comparison of the difference in frequency between the frequency of the synthesized signal output from the synthesizer circuit and the resonance frequency of the ensemble of atoms in the atomic spectroscopy circuit with a spectroscopy detection circuit; storing the operating settings in a memory; controlling the frequency of the synthesized signal generated by the synthesizer circuit and the resonance frequency of the ensemble of atoms in the atomic spectroscopy circuit with the operating settings; coupling digital pumping signals to a charge pump to generate a tuning voltage to tune the tunable LO; selectively applying the digital pumping signals from a phase-frequency detector circuit (PFDC) when an external reference signal is detected at an external reference input; and selectively applying the digital pumping signals based on an output of the spectroscopy detection circuit when an external reference signal is not detected at the external reference input using then current operating settings stored in the memory to maintain an output frequency of the atomic clock at an output frequency set by a last detected external reference signal.

Example 16 includes the method of Example 15, further including detecting the external reference signal with a signal level sensor.

Example 17 includes the method of any of the Examples 15-16, further including dynamically updating the stored operating settings when a difference between the frequency of the synthesized signal output from the synthesizer circuit and the resonance frequency of the ensemble of atoms in the atomic spectroscopy circuit is zero.

Example 18 includes the method of any of the Examples 15-17, wherein the digital pumping signals from the PFDC further include generating the digital pumping signals based on comparison of the frequency of the tunable LO to a frequency of the external reference signal detected at the external reference input.

Example 19 includes the method of any of the Examples 15-18, further including resetting the operating settings to factory operating settings based on a received reset input signal.

Example 20 includes the method of any of the Examples 15-19, wherein controlling the frequency of the synthesized signal generated by the synthesizer circuit and the resonance frequency of the ensemble of atoms in the atomic spectroscopy circuit with the operating settings further includes controlling the frequency of the synthesized signal generated by the synthesizer circuit with a synthesizer tuning word of the operating settings; and controlling the resonance frequency of the ensemble of atoms in the atomic spectroscopy circuit with an atom tuning word of the operating settings.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. An atomic clock comprising:
a tunable local oscillator (LO), an output of the tunable LO coupled to a user output of the atomic clock;
a charge pump configured to adjust the tunable LO with a LO tuning voltage;
a follower circuit configured to set an output frequency of the atomic clock to a frequency of an external reference signal coupled to an external reference input;
an atom referenced circuit configured to set the output frequency of the atomic clock to a frequency based on stored operating settings;
a switch configured to selectively couple one of the follower circuit and the atom referenced circuit to the charge pump;
a controller configured to control the switch based on a detected external reference signal coupled to the external reference input; and
a memory configured to store at least the operating settings and operating instructions implemented by the controller, the controller configured to store then current operating settings generated based on a then current external reference signal coupled to the external reference input, the controller further configured to apply the stored then current operating settings to the atom referenced circuit when the then current external reference signal is removed from the external reference input to maintain the output frequency of the atomic clock at the output frequency set by the follower circuit when the external reference signal was coupled to the external reference input.

2. The atomic clock of claim 1, further comprising:
a signal level sensor in communication with the external reference input, the signal level sensor configured to communicate an external reference detected signal to the controller when the external reference signal is coupled to the external reference input.

3. The atomic clock of claim 2, wherein the follower circuit further comprises:
a phase-frequency detector circuit (PFDC) configured to selectively compare a frequency of a signal output from the tunable LO to the frequency of the external reference signal at the external reference input and generate PFDC digital pumping signals in response to the comparison when a signal is detected by the signal level sensor, the PFDC digital pumping signals being in communication with the switch.

4. The atomic clock of claim 1, wherein the atom referenced circuit further comprises:
a synthesizer circuit configured to create a synthesized signal having a frequency that is a rational number multiple of the frequency of the tunable LO based on a synthesizer tuning word from the operator settings communicated to the synthesizer circuit in a synthesizer tuning word signal provided by the controller;
an atomic spectroscopy circuit configured to excite an ensemble of atoms with the synthesized signal, the atomic spectroscopy circuit further configured to change an atomic resonant frequency of the ensemble of atoms with an application of an electromagnetic field having a strength based on an atom tuning word from the operator settings communicated to the atomic spectroscopy circuit in an atom tuning word signal provided by the controller;
a spectroscopy detection circuit configured to output a difference signal indicating a difference in frequency between the frequency of the synthesized signal and the resonance frequency of the ensemble of atoms; and
the controller configured to generate the synthesizer tuning word and the atom tuning word based on the output of the spectroscopy detection circuit, the controller configured to store a current synthesizer tuning word and a current atom tuning word in the memory when the difference signal output of the spectroscopy detection circuit is zero.

5. The atomic clock of claim 4, further comprising:
a charge pump controller configured to generate controller digital pump signals selectively communicated to the charge pump based on a steering voltage generated by the controller, wherein the steering voltage is based on an output of the spectroscopy detection circuit.

6. The atomic clock of claim 4, wherein the atomic spectroscopy circuit further comprising:
a vacuum chamber to contain the ensemble of atoms; and
an atom manipulation system configured to manipulate a resonance frequency of the ensemble of atoms.

7. The atomic clock of claim 6, wherein the atom manipulation system includes a coil wrapped around the chamber, the coil configured to generate a magnetic field to manipulate the resonance frequency of the ensemble of atoms.

8. The atomic clock of claim 1, further comprising a reset input configured to receive a result input, the controller configured to reset the output of the atomic clock based on factory operating settings stored in a memory.

9. The atomic clock of claim 1 wherein the charge pump includes a loop filter circuit.

10. An atomic clock comprising:
a tunable local oscillator (LO) having a frequency tuned by a LO tuning voltage, the tunable LO in communication with a user output of the atomic clock;
a synthesizer circuit creating a synthesized signal having a frequency that is a rational number multiple of the frequency of the tunable LO based on a synthesizer tuning word in a received synthesizer tuning word signal;
an ensemble of atoms having a spectroscopic response at an atomic resonance frequency;
an atomic spectroscopy circuit configured to excite the ensemble of atoms with the synthesized signal, the atomic spectroscopy circuit further configured to change the atomic resonant frequency of the ensemble of atoms with an application of an electromagnetic field having a strength based on an atom tuning word in a received atom tuning word signal;
a spectroscopy detection circuit configured to output a difference signal indicating a difference in frequency between the frequency of the synthesized signal and the atomic resonance frequency of the ensemble of atoms;
a memory configured to store operating settings and operating instructions, the operating settings including the synthesizer tuning word and the atom tuning word;
a controller in communication with the memory, the controller configured to at least implement the operating instructions and store the operating settings, the controller configured to determine the operating settings based at least in part on the output of the spectroscopy detection circuit, the controller further configured to generate controller digital pumping signals based at least in part on the output of the spectroscopy detection circuit, the controller also configured to store then current operating settings generated based on a then current external reference signal coupled to an external reference input to the atomic clock, the controller further configured to apply a synthesizer tuning word associated with the stored then current operating settings to the synthesizer circuit and an atomic tuning word associated with the then current operating settings to the atomic spectroscopy circuit when the then current external reference signal is removed from the external reference input to maintain the output frequency of the atomic clock at the output frequency set by the removed then current external reference signal;

a charge pump in communication with the tunable LO to generate the LO tuning voltage used by the tunable LO, the charge pump including an input;

a signal level sensor configured to detect an external reference signal at the external reference input, the signal level sensor in communication with the controller;

a phase-frequency detector circuit (PFDC) configured to selectively compare the frequency of the tunable LO to a frequency of the external reference signal at the external reference input and generate PFDC digital pumping signals in response to the comparison when a signal is detected by the signal level sensor; and a switch configured to selectively couple one of the controller digital pumping signals from the controller and PFDC digital pumping signals from the PFDC to the input of the charge pump to generate the LO tuning voltage that tunes the tunable LO, the controller configured to control a position of the switch based on an output of the signal level sensor.

11. The atomic clock of claim 10, wherein the controller is further configured to store a factory determined synthesizer tuning word and a factory determined atom tuning word that is used when a reset signal is received by the controller.

12. The atomic clock of claim 11, further comprising:
a reset input in communication with the controller to communicate the reset signal to the controller.

13. The atomic clock of claim 10, wherein the controller dynamically updates a stored synthesizer tuning word and a factory determined atom tuning word based at least in part on a then current output of the spectroscopy detection circuit.

14. The atomic clock of claim 10, wherein the charge pump includes a loop filter circuit.

15. A method of operating an atomic clock, the method comprising:
generating a synthesized signal with a synthesizer circuit that has a frequency that is a rational number multiple of a frequency of a tunable local oscillator (LO) signal from a tunable LO that is communication with a user output of the atomic clock;
comparing a difference in frequency between the frequency of the synthesized signal output from the synthesizer circuit and a resonance frequency of an ensemble of atoms in an atomic spectroscopy circuit;
generating operating settings used by the synthesizer circuit and the atomic spectroscopy circuit based on the comparison of the difference in frequency between the frequency of the synthesized signal output from the synthesizer circuit and the resonance frequency of the ensemble of atoms in the atomic spectroscopy circuit with a spectroscopy detection circuit;
storing the operating settings in a memory;
controlling the frequency of the synthesized signal generated by the synthesizer circuit and the resonance frequency of the ensemble of atoms in the atomic spectroscopy circuit with the operating settings;
coupling digital pumping signals to a charge pump to generate a tuning voltage to tune the tunable LO;
selectively applying the digital pumping signals from a phase-frequency detector circuit (PFDC) when an external reference signal is detected at an external reference input; and
selectively applying the digital pumping signals based on an output of the spectroscopy detection circuit when an external reference signal is not detected at the external reference input using then current operating settings stored in the memory to maintain an output frequency of the atomic clock at an output frequency set by a last detected external reference signal.

16. The method of claim 15, further comprising:
detecting the external reference signal with a signal level sensor.

17. The method of claim 15, further comprising:
dynamically updating the stored operating settings when a difference between the frequency of the synthesized signal output from the synthesizer circuit and the resonance frequency of the ensemble of atoms in the atomic spectroscopy circuit is zero.

18. The method of claim 15, wherein the digital pumping signals from the PFDC further comprises:
generating the digital pumping signals based on comparison of the frequency of the tunable LO to a frequency of the external reference signal detected at the external reference input.

19. The method of claim 15, further comprising:
resetting the operating settings to factory operating settings based on a received reset input signal.

20. The method of claim 15, wherein controlling the frequency of the synthesized signal generated by the synthesizer circuit and the resonance frequency of the ensemble of atoms in the atomic spectroscopy circuit with the operating settings further comprises:
controlling the frequency of the synthesized signal generated by the synthesizer circuit with a synthesizer tuning word of the operating settings; and
controlling the resonance frequency of the ensemble of atoms in the atomic spectroscopy circuit with an atom tuning word of the operating settings.

* * * * *